(12) United States Patent
Ikenaga et al.

(10) Patent No.: US 7,943,427 B2
(45) Date of Patent: May 17, 2011

(54) SEMICONDUCTOR DEVICE, SUBSTRATE FOR PRODUCING SEMICONDUCTOR DEVICE AND METHOD OF PRODUCING THEM

(75) Inventors: Chikao Ikenaga, Tokyo-To (JP); Kentarou Seki, Tokyo-To (JP); Kazuhito Hosokawa, Ibaraki (JP); Takuji Okeyui, Ibaraki (JP); Keisuke Yoshikawa, Ibaraki (JP); Kazuhiro Ikemura, Ibaraki (JP)

(73) Assignees: Dai Nippon Printing Co., Ltd., Tokyo (JP); Nitto Denko Corporation, Ibaraki-shi (JP)

( * ) Notice: Subject to any disclaimer, the term of this patent is extended or adjusted under 35 U.S.C. 154(b) by 868 days.

(21) Appl. No.: 11/632,131

(22) PCT Filed: Jul. 13, 2005

(86) PCT No.: PCT/JP2005/012907
§ 371 (c)(1),
(2), (4) Date: Jan. 11, 2007

(87) PCT Pub. No.: WO2006/009030
PCT Pub. Date: Jan. 26, 2006

(65) Prior Publication Data
US 2008/0048311 A1 Feb. 28, 2008

(30) Foreign Application Priority Data
Jul. 15, 2004 (JP) .................................. 2004-208323

(51) Int. Cl.
*H01L 21/00* (2006.01)
(52) U.S. Cl. .......................... 438/118; 438/671; 438/686

(58) Field of Classification Search .................. 438/118, 438/671, 686, 666, 652, 113, 127, 460
See application file for complete search history.

(56) References Cited

U.S. PATENT DOCUMENTS 6,451,627 B1 * 9/2002 Coffman ....................... 438/111
(Continued)

FOREIGN PATENT DOCUMENTS

| JP | A 9-252014 | 9/1997 |
| JP | A 2001-210743 | 8/2001 |
| JP | A-2001-274184 | 10/2001 |

(Continued)

OTHER PUBLICATIONS

Dec. 10, 2010 Japanese Office Action issued in Japanese Patent Application No. 2006-519633.

*Primary Examiner* — Zandra Smith
*Assistant Examiner* — Telly D Green
(74) *Attorney, Agent, or Firm* — Oliff & Berridge, PLC

(57) ABSTRACT

A substrate B for use in production of a semiconductor device is used, which substrate includes an adhesive sheet 50 having a base layer 51 and an adhesive layer 52, and a plurality of independently provided electrically conductive portions 20. A semiconductor element having electrodes 11 formed thereon is firmly fixed onto the substrate B, and upper portions of the plurality of electrically conductive portions 20 and the electrodes 11 of the semiconductor element 10 are electrically connected by using wires 30. The semiconductor element 10, wires 30 and electrically conductive portions 20 are sealed by using a sealing resin 40. Each of the electrically conductive portions 20 has overhanging portions 20a, and a side face 60a of the electrically conductive portion 20 is roughened, thus enhancing the joining strength between each electrically conductive portion 20 and the sealing resin 40.

3 Claims, 9 Drawing Sheets

U.S. PATENT DOCUMENTS

| | | | |
|---|---|---|---|
| 6,528,893 B2 * | 3/2003 | Jung et al. | 257/787 |
| 7,064,011 B2 * | 6/2006 | Ikenaga et al. | 438/118 |
| 2004/0097081 A1 * | 5/2004 | Igarashi et al. | 438/689 |
| 2004/0164387 A1 * | 8/2004 | Ikenaga et al. | 257/678 |
| 2005/0056916 A1 * | 3/2005 | Sakamoto et al. | 257/672 |
| 2006/0145363 A1 * | 7/2006 | Ikenaga et al. | 257/787 |
| 2007/0241445 A1 * | 10/2007 | Ikenaga et al. | 257/693 |

FOREIGN PATENT DOCUMENTS

| | | |
|---|---|---|
| JP | A 2001-274184 | 10/2001 |
| JP | A-2002-299549 | 10/2002 |
| JP | A 2004-119726 | 4/2004 |
| JP | A-2004-119726 | 4/2004 |
| JP | A-2004-207300 | 7/2004 |

* cited by examiner

SEMICONDUCTOR DEVICE, SUBSTRATE FOR PRODUCING SEMICONDUCTOR DEVICE AND METHOD OF PRODUCING THEM

BACKGROUND OF THE INVENTION

1. Field of the Invention

The present invention relates to a technical field of a surface-mounting type semiconductor device, and particularly to a technical field of a surface-mounting type semiconductor device having a leadless structure.

2. Background Art

Generally, a semiconductor device includes a metallic lead frame as one component thereof, and micromachining for the pitch of leads in the lead frame is required for forming a greater number of pins therein. However, if attempting to reduce the width of each lead itself, the strength of the lead is lowered, and a short circuit may tend to occur due to bending or the like of the lead. Accordingly, it is unavoidable to upsize the package in order to ensure the pitch of each lead. Thus, a semiconductor device including a lead frame tends to have a package of a greater size and thickness. Therefore, a surface-mounting type semiconductor device having a leadless structure has been proposed.

Patent Document 1: TOKUKAIHEI No. 9-252014, KOHO

Patent Document 2: TOKUKAI No. 2001-210743, KOHO

A semiconductor device described in the Patent Document 1 is shown in FIGS. 11(a) and 11(b). The method of producing the semiconductor device comprises attaching a metal foil onto a base material 101 and etching it such that the metal foil remains at predetermined portions, fixing a semiconductor element 102 onto a metal foil 103a (die pad) having substantially the same size as that of the semiconductor element 102, electrically connecting the semiconductor element 102 and metal foils 103b via wires 105, and transfer molding the connected structure with a sealing resin 106 using a mold. Finally, the molded sealing resin 106 is removed from the base material 101 to form a package of the semiconductor element (FIG. 11b). However, in the semiconductor device formed by this production method, no countermeasure for enhancing the strength of joining each metal foil 103b as a terminal to the sealing resin 106 is provided. Therefore, in the case of further increasing the number of pins of the semiconductor device, downsizing the device and micromachining for the metal foils 103b, the wires tend to disconnect due to peeling of the metal foils 103b. Thus, there is a need for enhancing the strength of joining the metal foils 103b to the resin.

In the method described in the Patent Document 1, sufficient close adhesion between the base material and metal foils is required in the step of etching the metal foil and the molding step using a sealing resin. However, after the molding step, easy separation between the base material and the molding resin and between the base material and the metal foils is also required. As such, the base material and the metal foils are required to have properties which are contrary to each other in the close adhesion property. Namely, while durability to chemicals used for the etching as well as durability that prevents misregistration of the semiconductor element under a high temperature condition in the molding step or under pressure to be applied when the sealing resin flows in the mold are required, after the molding step, easy separation between the base material and the sealing resin and between the base material and the metal foils is required. However, Teflon® materials, silicon materials or metals having Teflon® coatings can not possibly satisfy such a required close adhesion property.

FIGS. 12(a) and 12(b) illustrate a semiconductor device described in the Patent Document 2. Generally, the semiconductor device is produced by the following method. First, a metal plate 201 is obtained by forming square-shaped concave grooves 201a in a metal plate 201 used as a base material. Next, a semiconductor device 202 is fixed onto the metal plate 201 using an adhesive 203, wires 204 are then formed by wire bonding at positions required for a design, thereafter the so formed structure is transfer molded with a sealing resin 205 (FIG. 12(a)). Subsequently, the metal plate 201 and adhesive 203 are grinded together, and the metal plate 201 is cut with the sealing resin 205 in accordance with dimensions conforming to the design so as to obtain a semiconductor device (FIG. 12(b)). However, also in this method, the semiconductor device obtained is not provided with any countermeasure for enhancing the strength of joining the metal plate 201 used as terminals to the sealing resin 205. As in the case of Patent Document 1, with further increase of the number of pins of the semiconductor device and the need of downsizing the device, micromachining of the metal plate 201 should be required. However, when the metal plate 201 is subjected to micromachining, the sealing resin tends to be peeled off. Thus, there is a need for enhancing the strength of joining the sealing resin 205 and the metal plate 201 as well as a need for a multi-pin type small-sized highly reliable semiconductor device.

As described above, in the conventional production methods, for realizing a multi-pin type small-sized semiconductor device, micromachining of electrically conductive portions (terminals) must be required, thus degrading the strength of joining the electrically conductive portions to the sealing resin and making the electrically conductive portions tend to be peeled off from the sealing resin. Therefore, there has been a need for a highly reliable multi-pin type small-sized semiconductor device. In addition, with respect to the need for thinning the semiconductor device, it is required for the conventional methods to grind the semiconductor element (chip) itself into a thinner one so as to obtain a thin type semiconductor device, thus increasing occurrence of breakage or cracks in the semiconductor element during such a production step and hence leading to increase of the cost.

SUMMARY OF THE INVENTION

The present invention was made in light of the above problems. It is therefore an object of the present invention to provide a semiconductor device having a highly reliable multi-pin type small-sized leadless (lead-free) structure. Specifically, it is an object of this invention to provide a surface-mounting type semiconductor device which is excellent in the strength of joining the sealing resin and the electrically conductive portions as well as to provide a substrate for use in production of the semiconductor device and a method of producing them. Another object of this invention is to provide a semiconductor device having a leadless structure which is capable of thinning, a substrate for use in production of the semiconductor device and a method of producing them.

The present invention is a semiconductor device, comprising: a semiconductor element having electrodes; a plurality of electrically conductive portions arranged around the semiconductor element; wires for respectively connecting the electrodes of the semiconductor element and the electrically conductive portions; and a sealing resin for sealing the semiconductor element, electrically conductive portions and wires; wherein each electrically conductive portion includes a metal foil comprising copper or a copper alloy, and a plating layer for an electrically conductive portion, the plating layer being provided on at least an upper portion of the metal foil; wherein the plating layer for an electrically conductive portion provided on an upper portion of the metal foil constitutes an overhanging portion which overhangs outside from the metal foil; and wherein a back side of each electrically conductive portion is exposed outside from the sealing resin.

The present invention is the semiconductor device, wherein each electrically conductive portion further includes a plating layer for an electrically conductive portion at a lower portion of the metal foil, the lower plating layer for an electrically conductive portion projecting outside from the sealing resin.

The present invention is the semiconductor device, wherein a side face of the metal foil of each electrically conductive portion is roughened.

The present invention is a substrate for use in production of a semiconductor device, comprising: an adhesive sheet having a base layer and an adhesive layer provided on the base layer; and a plurality of electrically conductive portions provided on the adhesive layer of the adhesive sheet; wherein each electrically conductive portion includes a metal foil comprising copper or a copper alloy, and a plating layer for the electrically conductive portion, the plating layer being provided on at least an upper portion of the metal foil; and wherein the plating layer for each electrically conductive portion provided on an upper portion of the electrically conductive portion constitutes an overhanging portion which overhangs outside from the metal foil.

The present invention is the substrate for use in production of a semiconductor device, wherein each electrically conductive portion further includes a plating layer for an electrically conductive portion at a lower portion of the metal foil, the lower plating layer for the electrically conductive portion being embedded in the adhesive layer.

The present invention is the substrate for use in production of a semiconductor device, wherein a side face of the metal foil of each electrically conductive portion is roughened.

The present invention is the substrate for use in production of a semiconductor device, wherein the base layer is formed from a metal material.

The present invention is the substrate for use in production of a semiconductor device, wherein the thickness of the metal foil comprising copper or a copper foil of an electrically conductive portion is in the range of from 0.01 to 0.1 mm.

The present invention is the substrate for use in production of a semiconductor device, wherein the plating layer for an electrically conductive portion has a multi-layered structure including a nickel plating layer as a diffusion barrier layer for copper, and a mono-layered or multi-layered precious metal plating layer provided on the nickel plating layer, and wherein a precious metal used for the precious metal plating layer is any of Au, Ag, Pd.

The present invention is the substrate for use in production of a semiconductor device, wherein the elastic modulus at 200° C. of the base layer of the adhesive sheet is greater than 1.0 GPa and the elastic modulus at 200° C. of the adhesive layer is greater than 0.1 MPa.

In the present invention, it is preferred that the elastic modulus at 100 to 150° C. prior to curing of the adhesive constituting the adhesive layer of the adhesive sheet is lower than 0.1 MPa, and that the elastic modulus at 200° C. after curing is greater than 0.1 MPa. While the type of the adhesive is not limited in particular, it is preferred to use a thermosetting adhesive as the adhesive.

In the present invention, while the thermosetting adhesive is not limited in particular, it is preferred to use one containing, for example, an epoxy resin, an epoxy curing agent and an elastomer.

The present invention is the substrate for use in production of a semiconductor device, wherein the adhesive strength to a test metal foil of the adhesive layer of the adhesive sheet is in the range of from 0.1 to 15N/20 mm.

The present invention is the substrate for use in production of a semiconductor device, wherein the substrate for use in production of a semiconductor device includes a plurality of blocks arranged in a square pattern, each of the blocks including a region for fixing a semiconductor element, wherein each of the blocks is divided from one another by a cutting region, and wherein each electrically conductive portion is arranged such that it does not extends over the cutting region.

The present invention is a method of producing a substrate for use in production of a semiconductor device, comprising the steps of: preparing a metal foil comprising copper or a copper foil as a material for electrically conductive portions; providing partial plating to a portion corresponding to each electrically conductive portion of the metal foil so as to form a partially plating layer; attaching the metal foil having the partially plating layers formed thereon, with pressure, to an adhesive layer side of an adhesive sheet having a base layer and the adhesive layer; forming each electrically conductive portion by etching the metal foil using each partially plating layer as a resist; and defining an outer shape of the adhesive sheet by processing it.

The present invention is the method of producing a substrate for use in production of a semiconductor device, wherein in the step of forming each electrically conductive portion by etching the metal foil using each partially plating layer as a resist, a side face of the metal foil of each electrically conductive portion is roughened.

The present invention is a method of producing a semiconductor device, comprising the steps of: preparing a substrate for use in production of a semiconductor device, which substrate includes an adhesive sheet having a base layer, and an adhesive layer provided on the base layer, and a plurality of electrically conductive portions provided on the adhesive layer of the adhesive sheet, wherein each electrically conductive portion includes a metal foil comprising copper or a copper alloy, and a plating layer for an electrically conductive portion, the plating layer being provided on at least an upper portion of the metal foil, and wherein the plating layer for each electrically conductive portion provided on an upper portion of the electrically conductive portion constitutes an overhanging portion which overhangs outside from the metal foil; fixing each semiconductor element having electrodes onto the adhesive layer of the substrate for use in production of the semiconductor device, and electrically connecting the electrically conductive portions and the electrodes of the semiconductor element with wires; sealing the semiconductor element, wires and electrically conductive portions by using a sealing resin; separating the adhesive sheet from the sealing resin; and dividing the sealing resin into an individual piece for each semiconductor element.

According to the present invention, the joining strength between the electrically conductive portions which are used as connecting sites relative to external portions and the sealing resin can be significantly enhanced, thereby obtaining a semiconductor device which is excellent in reliability even when the electrically conductive portions have a minute shape. The plating layer provided on a bottom face of each electrically conductive portion of the semiconductor device according to the present invention is sealed with a resin while projecting, by the thickness of plating, from the back face of the semiconductor device, thus enhancing reliability of mounting when the semiconductor device is mounted onto a printed circuit board. Furthermore, since the semiconductor device has a leadless structure which is free of a lead frame, the electrically conductive portions can be subjected to micromachining so as to provide a further narrowed pitch. In addition, by eliminating a die pad which has been conventionally utilized, further thinning of the semiconductor can be achieved with the bottom face of a semiconductor element being exposed from the back face of the semiconductor device. By using the substrate for use in production of a semiconductor device according to the present invention, each semiconductor element can be fixed during the production process even without utilizing a die pad, and it can be sealed with a resin without causing any misregistration.

DETAILED DESCRIPTION OF THE INVENTION

One embodiment of the present invention will be described in detail with reference to the drawings.

Figure 1:
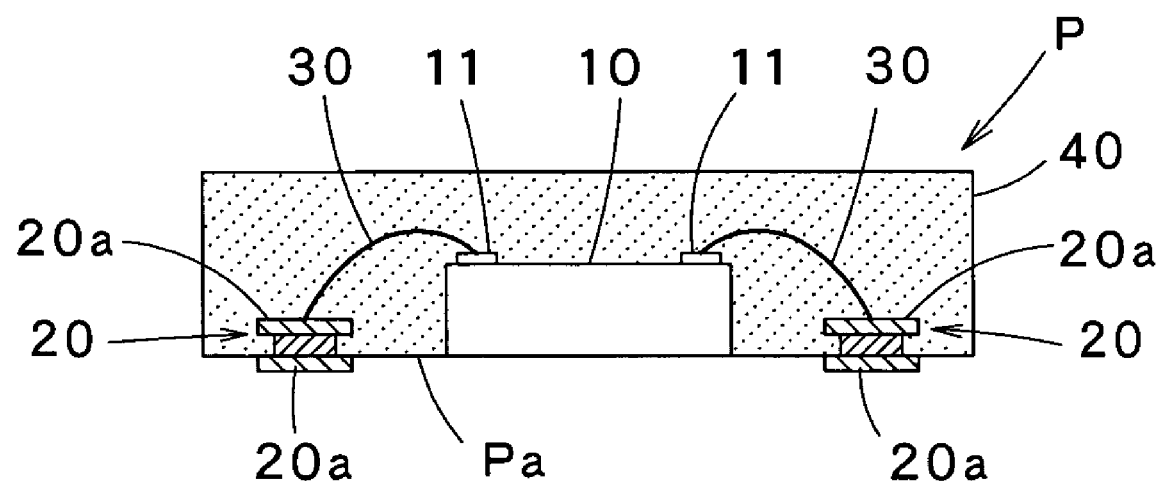
FIG. 1 is a schematic view showing one example of a semiconductor device according to the present invention.
Figure 2:
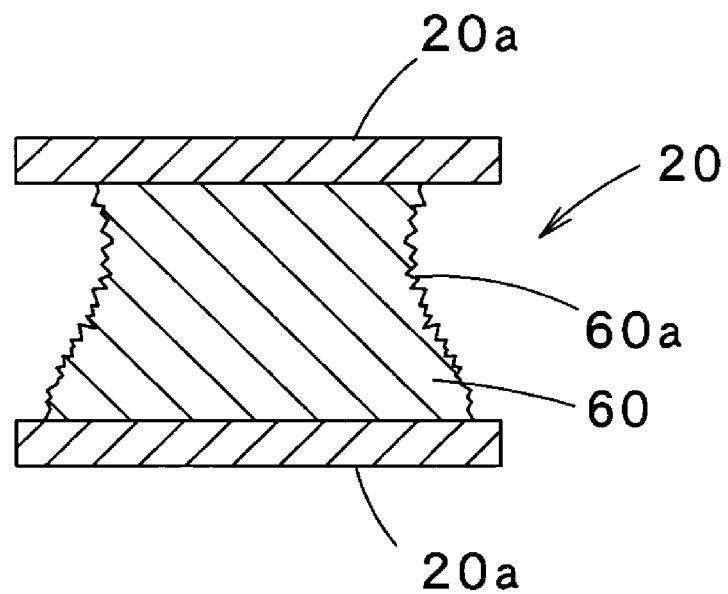
FIG. 2 is an enlarged view of an electrically conductive portion in the semiconductor device shown in FIG. 1.

As shown in FIGS. 1 and 2, a semiconductor device P comprises a semiconductor element 10 having electrodes 11, a plurality of electrically conductive portions 20 arranged around the semiconductor element 10, wires 30 for respectively connecting the electrodes 11 of semiconductor element 10 and the electrically conductive portions 20, and a sealing resin 40 for sealing the semiconductor element 10, electrically conductive portions 20 and wires 30.

Among these elements, each of the electrically conductive portions includes a metal foil 60 formed from copper or a copper alloy, and plating layers 20a for each electrically conductive portion provided on both top and bottom sides of the metal foil 60, each plating layer 20a constituting an overhanging portion which overhangs outside from the metal foil 60.

Each wire 30 is connected with the upper plating layer 20a of the electrically conductive portion 20, and the upper plating layer 20a serves as a functional face to be connected with each wire 30.

The back side of the semiconductor element 10 is exposed outside from the back side Pa (which is also the back side of the semiconductor device) of the sealing resin 40, the lower plating layer 20a of the electrically conductive portion 20 projects, by its thickness, from the back side Pa of the sealing resin 40. The metal foil 60 of each electrically conductive portion 20 has a roughened side face 60a.

Accordingly, the semiconductor device P shown in FIG. 1 has a configuration such that the bottom face of the semiconductor element 10 and the lower plating layer 20a of each electrically conductive portion 20 are exposed outside from the back face of the sealing resin 40, so as to form a leadless structure which is free of a die pad and an adhesive layer for fixing the semiconductor element. The upper overhanging portion 20a of each electrically conductive portion 20 displays an anchoring effect in the sealing resin 40, and the roughened side face 60a of each electrically conductive portion 20 is roughened to be firmly engaged with the sealing resin 40. Therefore, even in the case where each electrically conductive portion 20 has a minute shape, the strength of joining the electrically conductive portion 20 to the sealing resin 40 is significantly increased. In addition, the lower overhanging portion 20a provided at the bottom face of the electrically conductive portion 20 is formed of a plating layer, and the electrically conductive portion 20 is sealed with a resin, with the lower plating layer 20a projecting outside by its thickness, from the back face Pa of the semiconductor device P. Thus, upon mounting the semiconductor device P onto a printed circuit board, floating of the electrically conductive portions (terminals) due to unevenness or foreign matters on the mounted printed circuit board can be prevented, thereby enhancing reliability of the mounting process. In addition, a short circuit caused by a crushed solder cream can be prevented.

Figure 3:
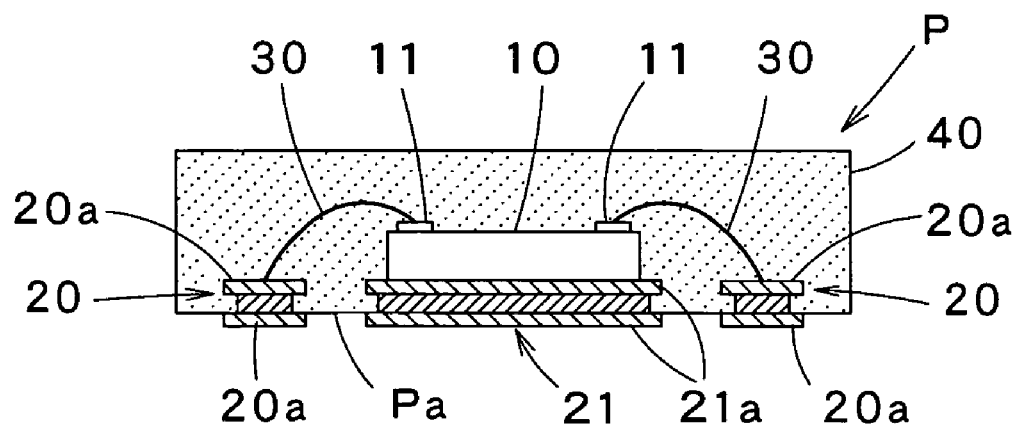
FIG. 3 is a schematic view showing another example of a semiconductor device according to the present invention.

FIG. 3 is a schematic view showing another example of a semiconductor device according to the present invention. While the semiconductor device P shown in FIG. 3 is one example in which a die pad is used as conventional, it has a configuration such that each electrically conductive portion 20 and a die pad portion 21 have upper and lower overhanging portions 20a, 21a, respectively. Therefore, even in the case where each electrically conductive portion 20 has a minute shape, the strength of joining the electrically conductive portion 20 to the sealing resin 40 is significantly increased because the upper overhanging portion 20a displays a significant anchoring effect in the sealing resin 40, as such achieving a semiconductor device with a higher reliability. In addition, the lower overhanging portion 20a provided at the bottom face of the electrically conductive portion 20 is formed of a plating layer, and the electrically conductive portion 20 is sealed with a resin, with the lower plating layer 20a projecting outside by its thickness, from the back face Pa of the semiconductor device P. Thus, upon mounting the semiconductor device P onto a printed circuit board, floating of the electrically conductive portions (terminals) due to unevenness or foreign matters on the mounted printed circuit board can be prevented, thereby enhancing reliability of the mounting process. In addition, a short circuit caused by a crushed solder cream can be prevented. It can be appreciated that only the overhanging portion 20a may be provided on each electrically conductive portion 20 without providing the overhanging portion 21a on the back face side of the die pad 21.

Figure 4:
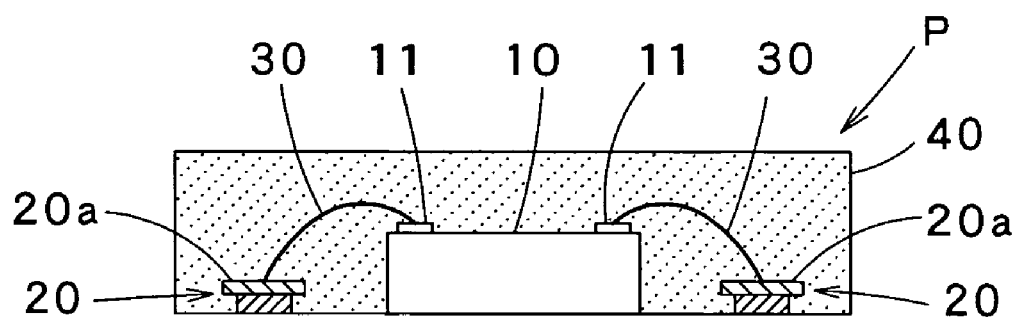
FIG. 4 is a schematic view showing still another example of a semiconductor device according to the present invention.
Figure 5:
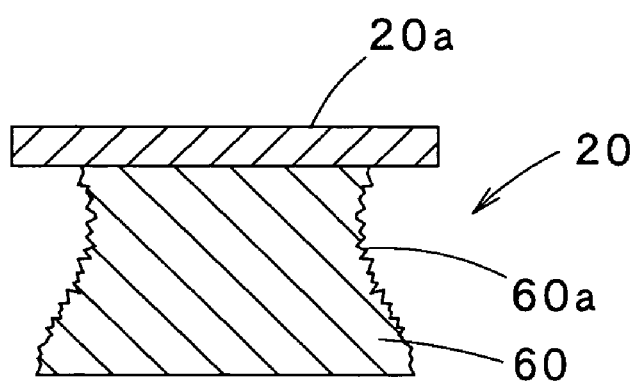
FIG. 5 is an enlarged view of an electrically conductive portion in the semiconductor device shown in FIG. 4.

FIG. 4 is a schematic view showing still another example of a semiconductor device according to the present invention. The semiconductor device shown in FIG. 4 has a lead-free structure similar to that shown in FIG. 1 except that each electrically conductive portion 20 has an overhanging portion 20a only at its upper functional face. In such a semiconductor device, the overhanging portion 20a of each electrically conductive portion 20 displays an anchoring effect in the sealing resin 40. As shown in an enlarged view of FIG. 5, each electrically conductive portion 20 has a roughened face 60a at its metal foil 60 so as to be firmly engaged with the sealing resin 40.

In conventional semiconductor devices, the thickness of the die pad is in the range of approximately 100 to 200 μm and the thickness of the adhesive layer for fixing the semiconductor element is in the range of approximately 10 to 50 μm. Therefore, according to the semiconductor device of the present invention, since there is no need for providing the die pad or the adhesive layer, if the thickness of the semiconductor element and the thickness of the sealing resin covering the semiconductor element are the same, the total thickness can be reduced by 110 to 250 μm.

FIGS. 6(a) to 6(d) are diagrams respectively illustrating steps of a production method of the semiconductor device shown in FIG. 1. The procedure of production will be described below with reference to these drawings.

Figure 6:
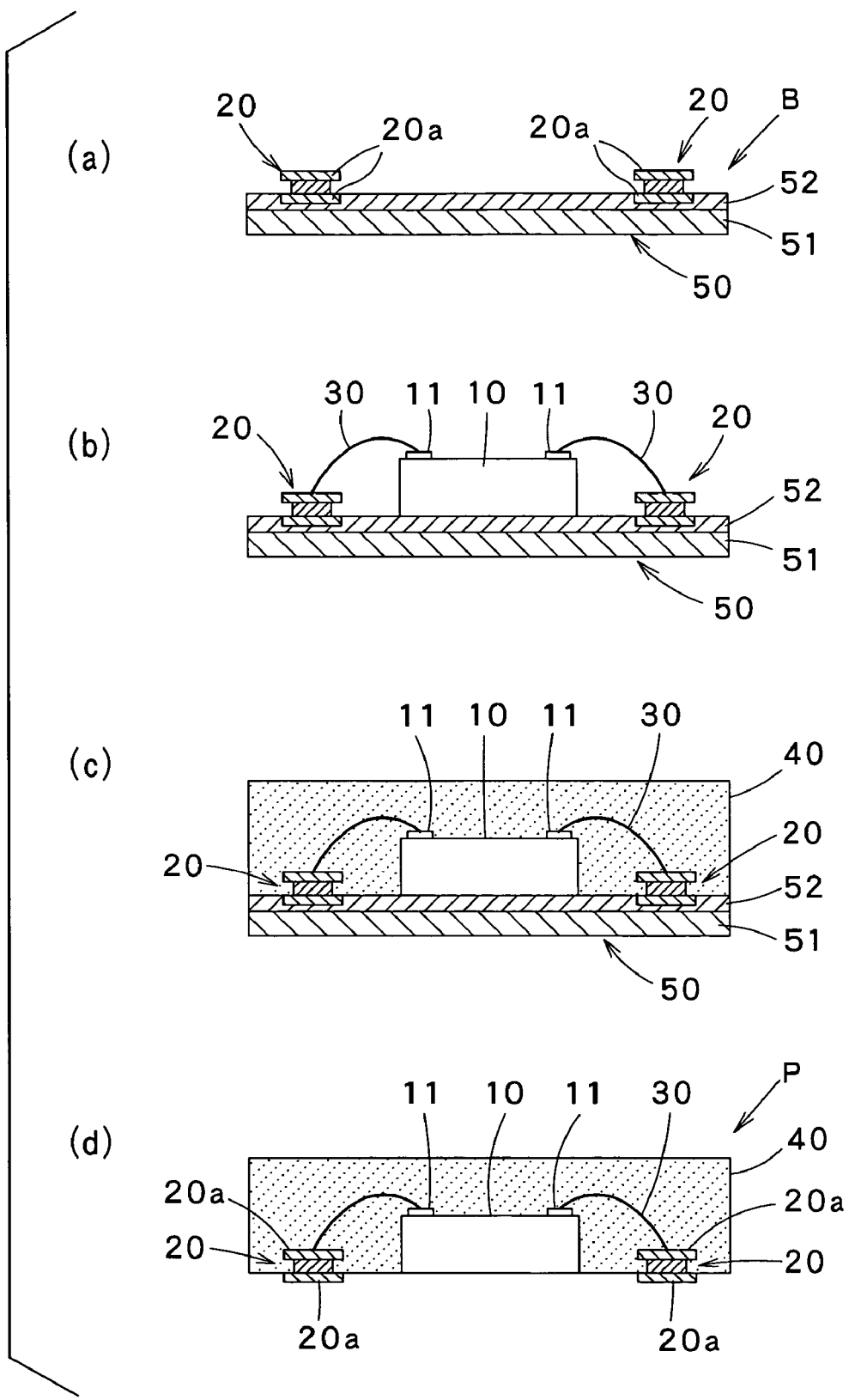
FIGS. 6(a) to 6(d) are diagrams respectively illustrating steps of a production method of the semiconductor device shown in FIG. 1.

First, as shown in FIG. 6(a), an adhesive sheet 50 having a base layer 51 and an adhesive layer 52 is prepared, and a plurality of electrically conductive portions 20 are then formed at selected positions on the adhesive layer 52 of the adhesive sheet so as to produce a substrate B. As shown in the drawing, each electrically conductive portion 20 has overhanging portions 20a at its top and bottom portions. The step of preparing the substrate B for use in production of a semiconductor device including such electrically conductive portions 20 will be described later.

Figure 7:
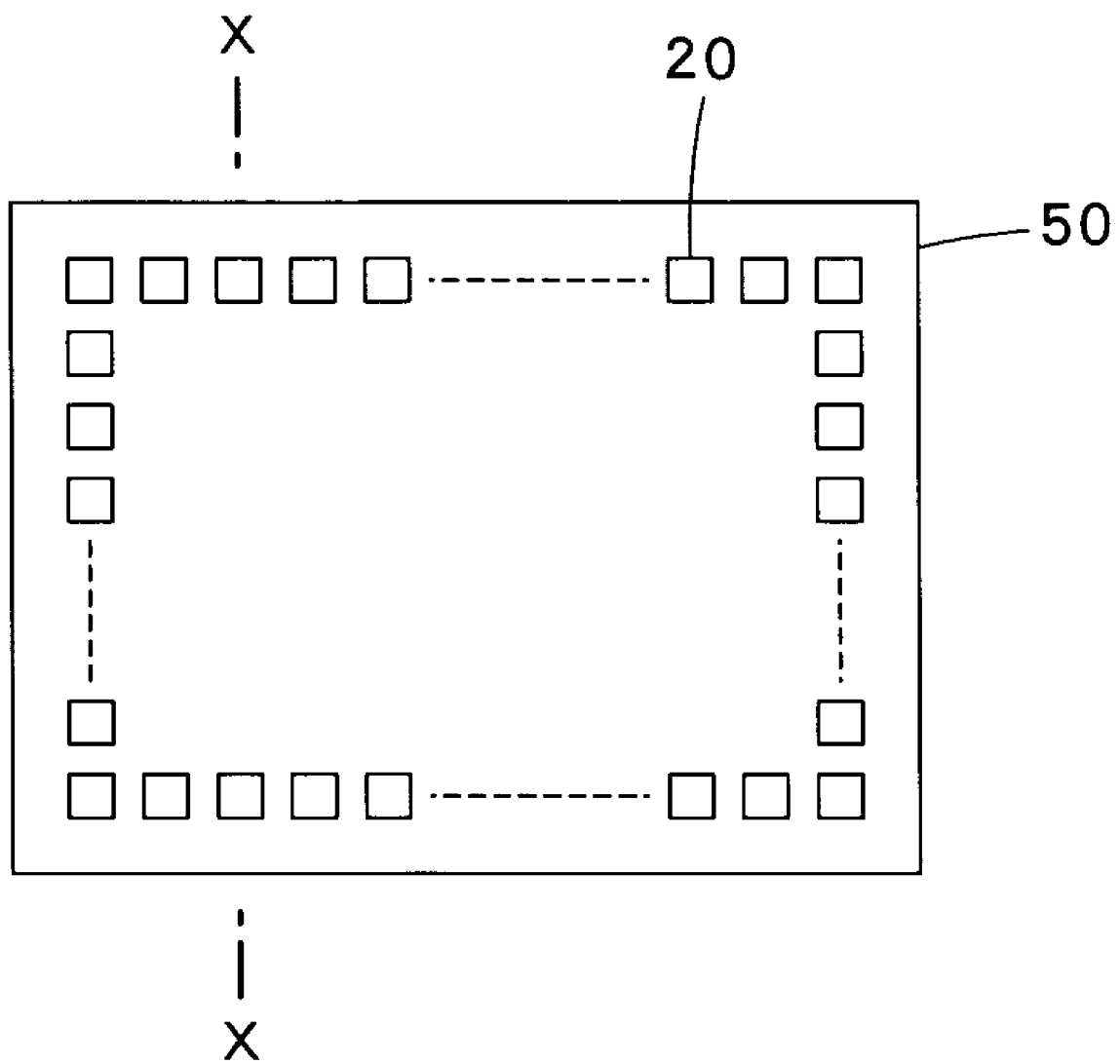
FIG. 7 is a diagram schematically showing a plan view of an adhesive sheet (substrate) at a point of time electrically conductive portions are formed in a step shown in FIG. 6.

FIG. 7 is a diagram schematically showing a plan view of the adhesive sheet 50 or substrate at a point of time the electrically conductive portions 20 are formed. In the drawing, the electrically conductive portions 20 are formed on the adhesive sheet 50 in large numbers corresponding to the number of the semiconductor elements 10, wherein the plurality of the electrically conductive portions 20 are electrically independent of one another.

Next, as shown in FIG. 6(b), the semiconductor element 10 having electrodes 11 formed thereon is fixed at a predetermined position on the substrate B via the adhesive layer 52 such that the side of the semiconductor element 10 on which the electrodes 11 are not formed faces the substrate B. Then, the plurality of electrically conductive portions 20 are electrically connected with the electrodes 11 of the semiconductor element 10 via the wires 30, respectively. If the strength of fixing the semiconductor element 10 onto the adhesive sheet 50 is not sufficient due to a smaller chip size of the element 10, the semiconductor element 10 may be firmly fixed onto the adhesive sheet 50 by using a die attachment material, such as a silver paste, die attachment film or the like. In this case, because the die pad is not used, the total thickness can be reduced by 100 to 200 μm as compared with the conventional semiconductor devices. It is noted that if the thickness of the semiconductor device is not so critical, it is also possible to use a substrate for use in production of a semiconductor device provided with the die pad portion 21 as in the case of semiconductor device P shown in FIG. 3.

Next, as shown in FIG. 6(c), the semiconductor device P is formed on the adhesive sheet 50 by sealing the semiconductor element 10, wires 30 and electrically conductive portions 20 with the sealing resin 40. The seal with the sealing resin 40 is performed by a typical transfer molding method using a mold. After the molding process, the sealing resin 40 is heated for post-curing as needed. Such a heating process for the post-curing may be prior to or after the separation of the adhesive sheet 50 described below. Subsequently, as shown in FIG. 6(d), the adhesive sheet 50 is separated from the sealing resin 40 to obtain the semiconductor device P shown in FIG. 1.

The steps of forming the substrate, i.e., the procedure of producing the substrate B for use in production of a semiconductor device by forming the electrically conductive portions 20 at selected positions on the adhesive layer 52 is shown in FIGS. 8(a) to 8(e). These steps can be described as follows.

Figure 8:
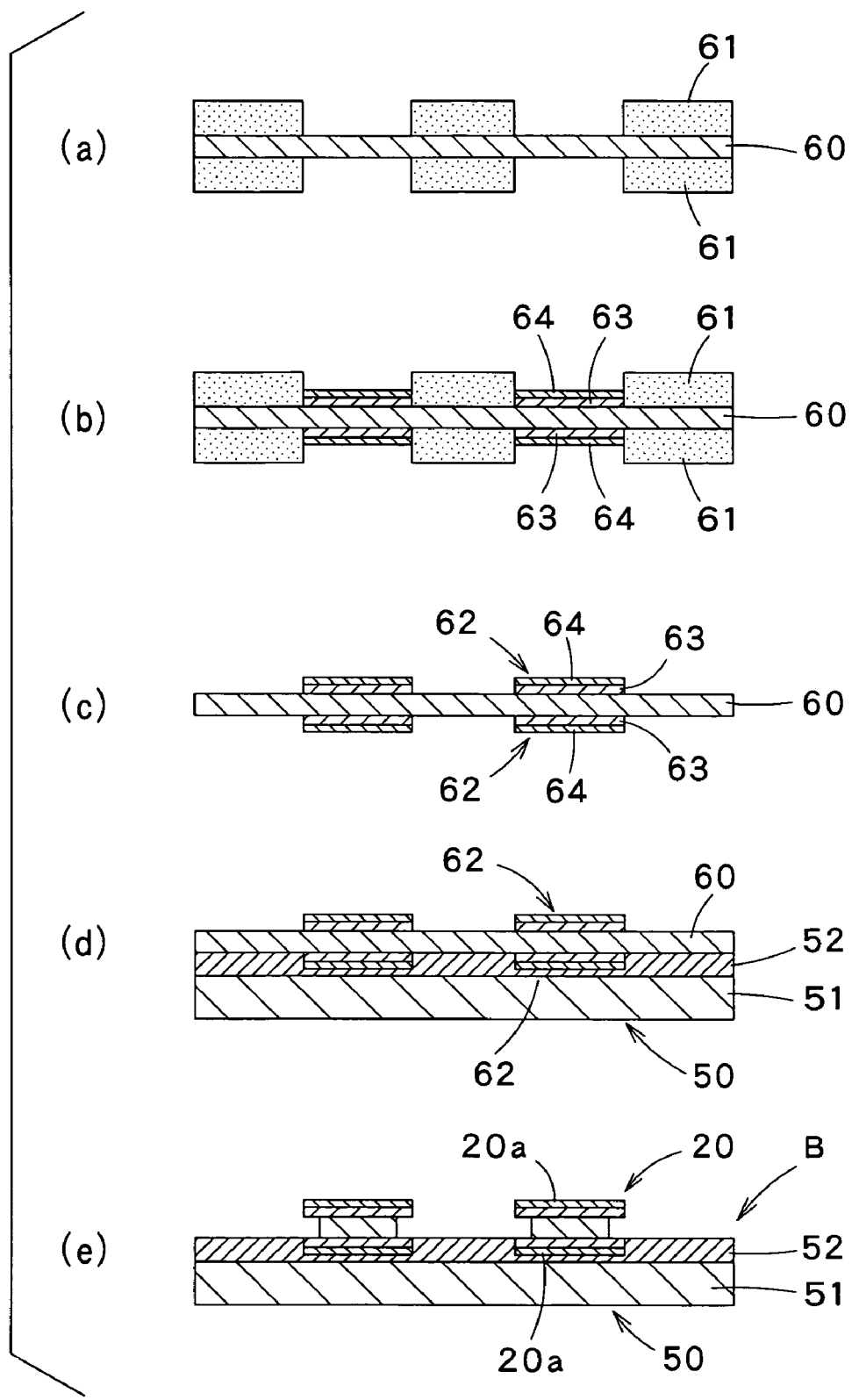
FIGS. 8(a) to 8(e) are diagrams respectively illustrating steps of preparing a substrate.

First, as shown in FIG. 8(a), the metal foil 60 comprising copper or a copper alloy is prepared as a material for the electrically conductive portions. As the metal foil 60, a material having a thickness of from 0.01 to 0.1 mm is used in view of strength. Thereafter, dry film resists 61 are attached onto both faces of the metal foil 60, and as shown in FIG. 8(a), patterning of the dry film resists 61 on both faces of the metal foil 60 is performed using a pattern which is reverse to the shape of the electrically conductive portions by using photolithography.

Next, as shown in FIG. 8(b), by using the pattern of dry film resists 61 as a mask, nickel plating layers, as diffusion barrier layers 63 for copper, and precious metal plating layers 64 are partially plated into the shape of the electrically conductive portions. Thereafter, as shown in FIG. 8(c), the dry film resists 61 are removed to form plating layers (partially plating layers) 62 for the electrically conductive portions. In this case, a precious metal used as the precious metal plating layer 64 may be any of at least Au, Ag, Pd. Additionally, each precious metal plating layer 64 may be mono-layered or multi-layered.

Figure 9:
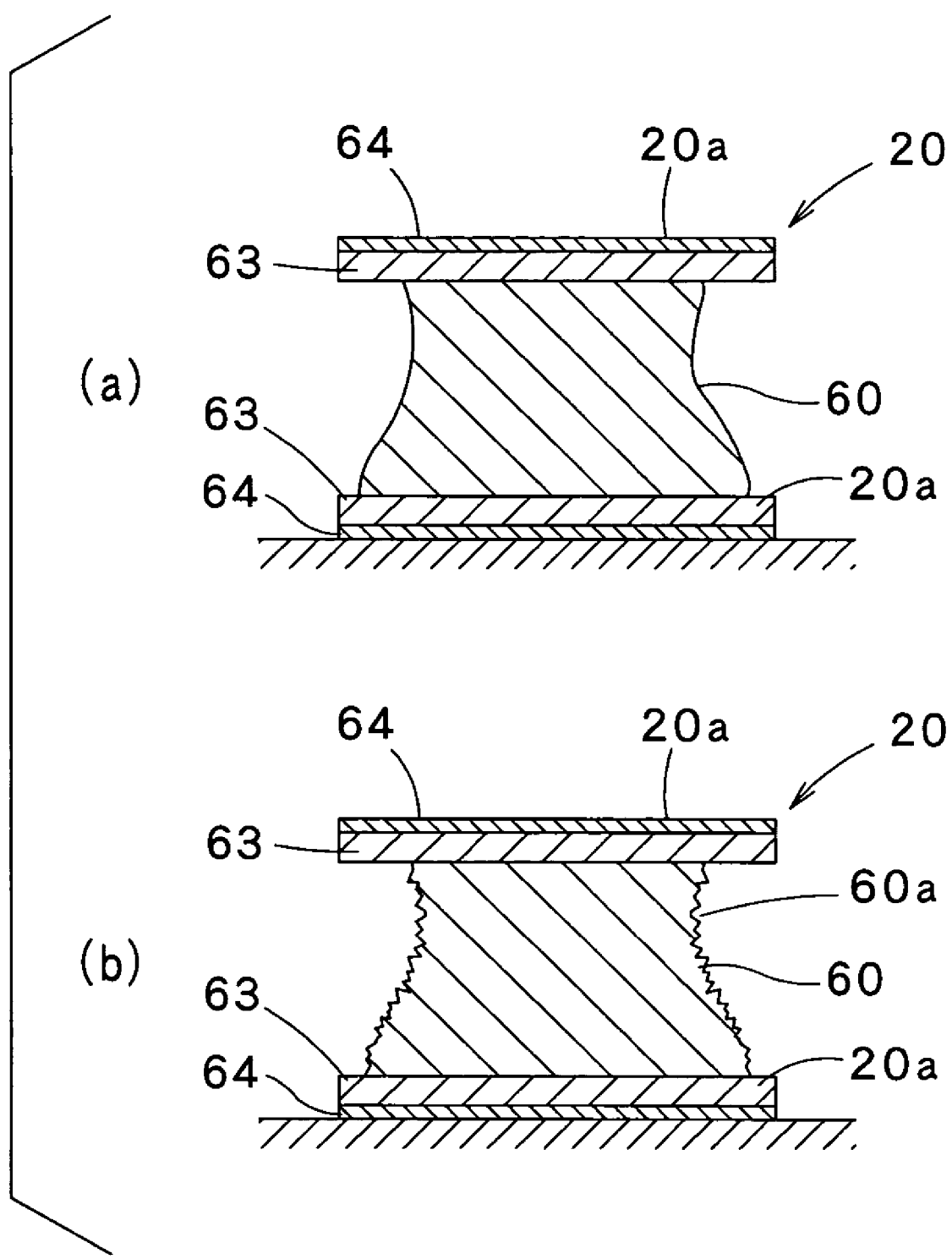
FIGS. 9(a) and 9(b) are diagrams illustrating an aspect of roughening a side face of a meal foil in an electrically conductive portion.

Subsequently, as shown in FIG. 8(d), the metal foil 60, on which the plating layers 62 for the electrically conductive portions each comprising the diffusion barrier layer 63 and the precious metal plating layer 64 are formed, is attached to the adhesive layer 52 of the adhesive sheet 50, while being pressed against the adhesive sheet 50, such that the plating layers 62 for the electrically conductive portions are embedded in the adhesive layer 52. Thereafter as shown in FIG. 8(e), the metal foil 60 in such an attached structure is etched, using the plating layers 62 for the electrically conductive portions as a resist, so as to form the electrically conductive portions 20. In this case, etching a side face 60a of each metal foil 60 can create such a shape that the upper and lower overhanging portions 20a comprising each plating portion 60a of the metal foil 60 are provided at the top and bottom portions of the metal foil 60 as shown in the drawing. Next, as shown in FIG. 9(a), a chemical treatment is provided to the side face 60a of each metal foil 60, so as to roughen the side face 60a of each metal foil 60 as shown in FIG. 9(b). In this way, after providing the overhanging portions 20a to both top and bottom faces of each metal foil 60 as well as roughening the side face 60a of each metal foil 60, the adhesive sheet 50 is processed by using a cutting means such as press working or the like so as to determine the outer shape of the adhesive sheet 50.

FIG. 8(a) to 8(e) respectively illustrate the case of forming electrically conductive portions each having overhanging portions at its both top and bottom faces. However, in the case of forming the electrically conductive portions 20 each having the overhanging portion 20a only at the functional face (the face used for wire bonding of each wire) of the metal foil as in the semiconductor device P shown in FIG. 4, the plating layer 62 for the electrically conductive portion is provided only at the functional face of the metal foil while the face on the side not provided with the plating layer of the metal foil 60 is attached to the adhesive sheet, so as to etch the metal foil 60 in that attached state. In this way, the electrically conductive portions 20 each having the overhanging portion 20a only at the functional face can be formed. Subsequently, a roughening process for the side face of each electrically conductive portion 20 is performed as already described with reference to FIGS. 9(a) and 9(b). In the case of forming the electrically conductive portions 20 and the die pad 21 as in the semiconductor device P shown in FIG. 3, the patterning of the dry resist film 61 is performed such that a space corresponding to the die pad is provided in the step of FIG. 8(a).

Figure 10:
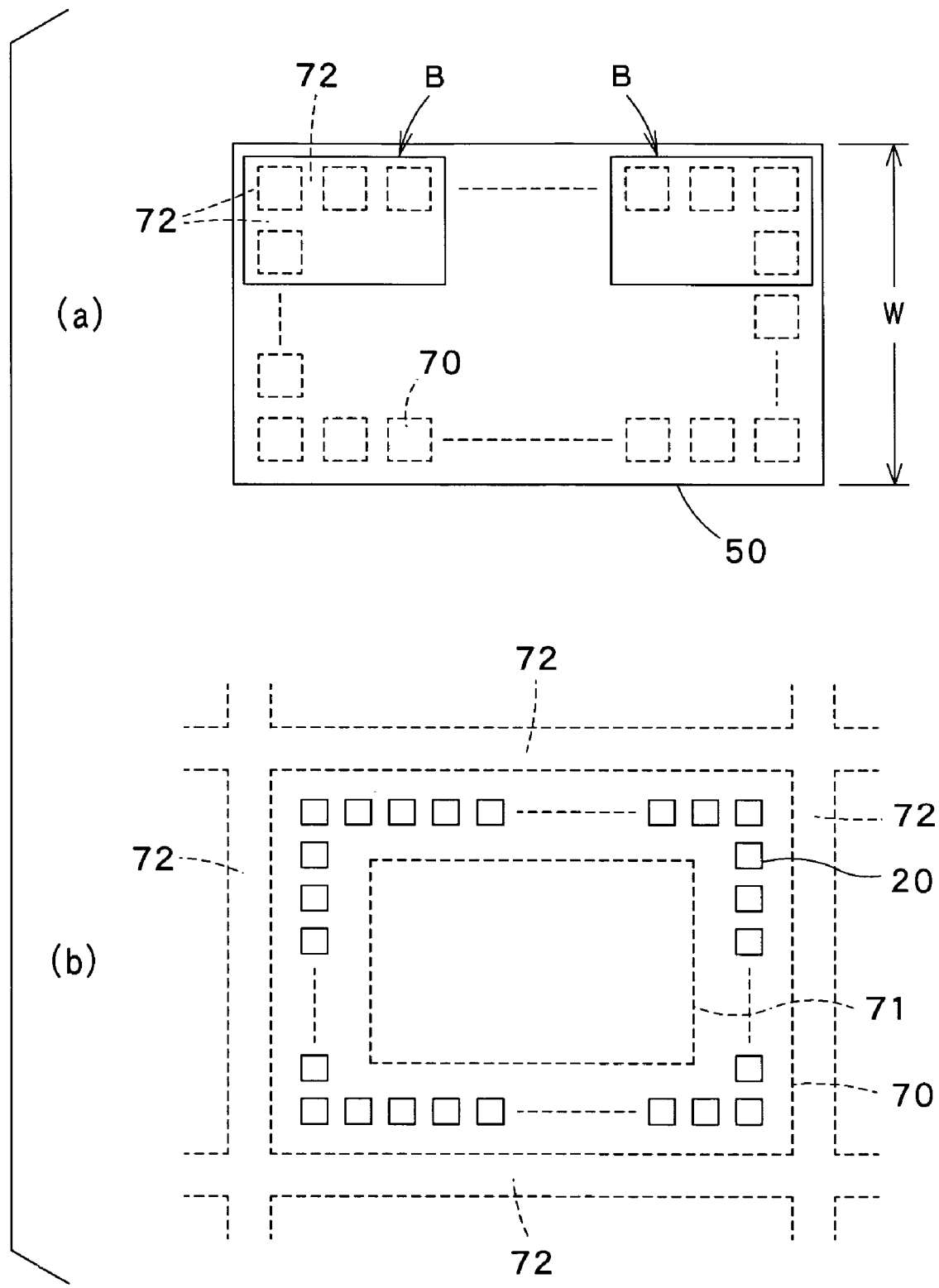
FIGS. 10(a) and 10(b) are top views respectively illustrating a step of preparing a substrate in a production method of a semiconductor device according to the present invention, with electrically conductive portions being formed on an adhesive sheet.
Figure 11:
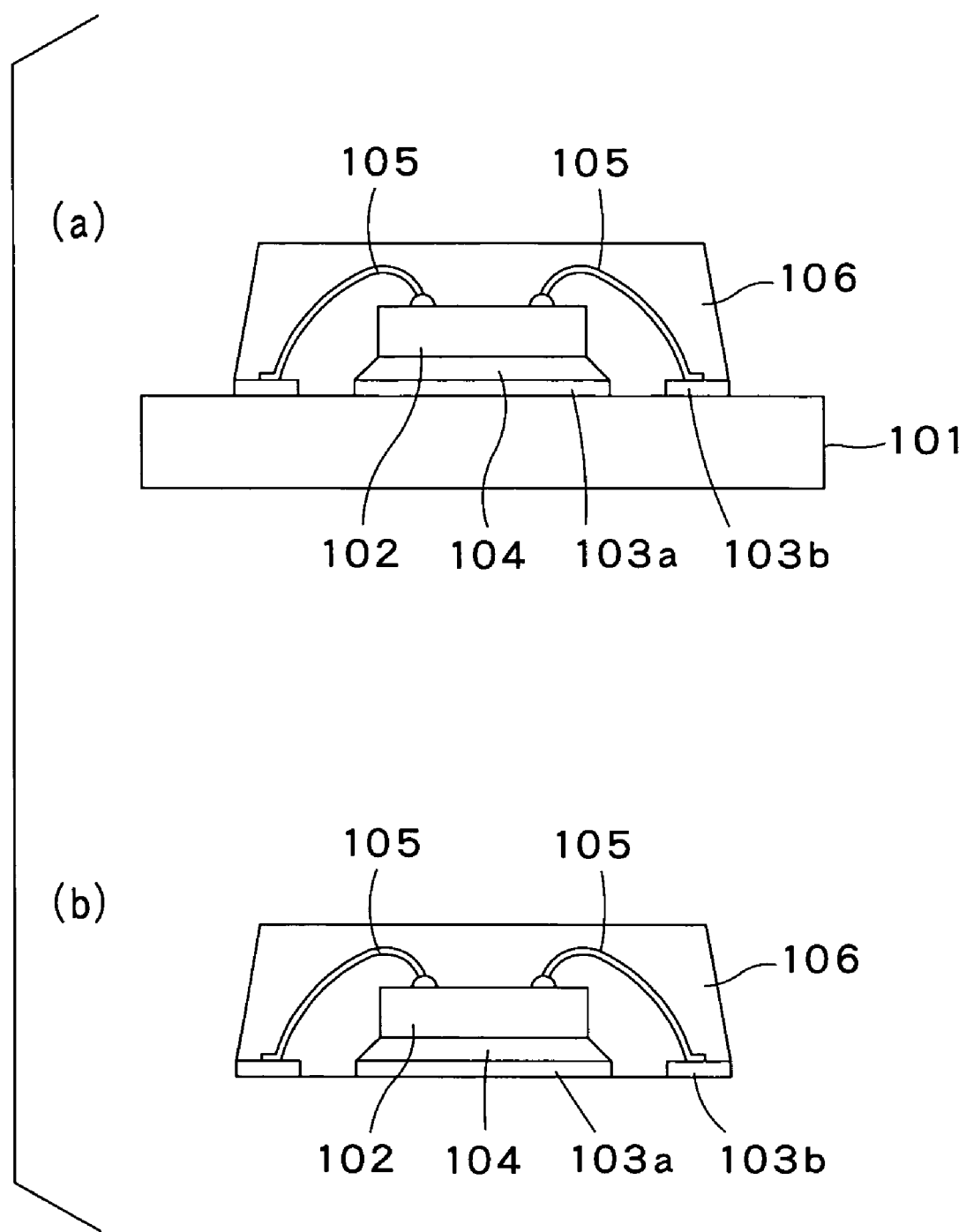
FIGS. 11(a) and 11(b) are diagrams illustrating one example of a conventional semiconductor device having a leadless structure.
Figure 12:
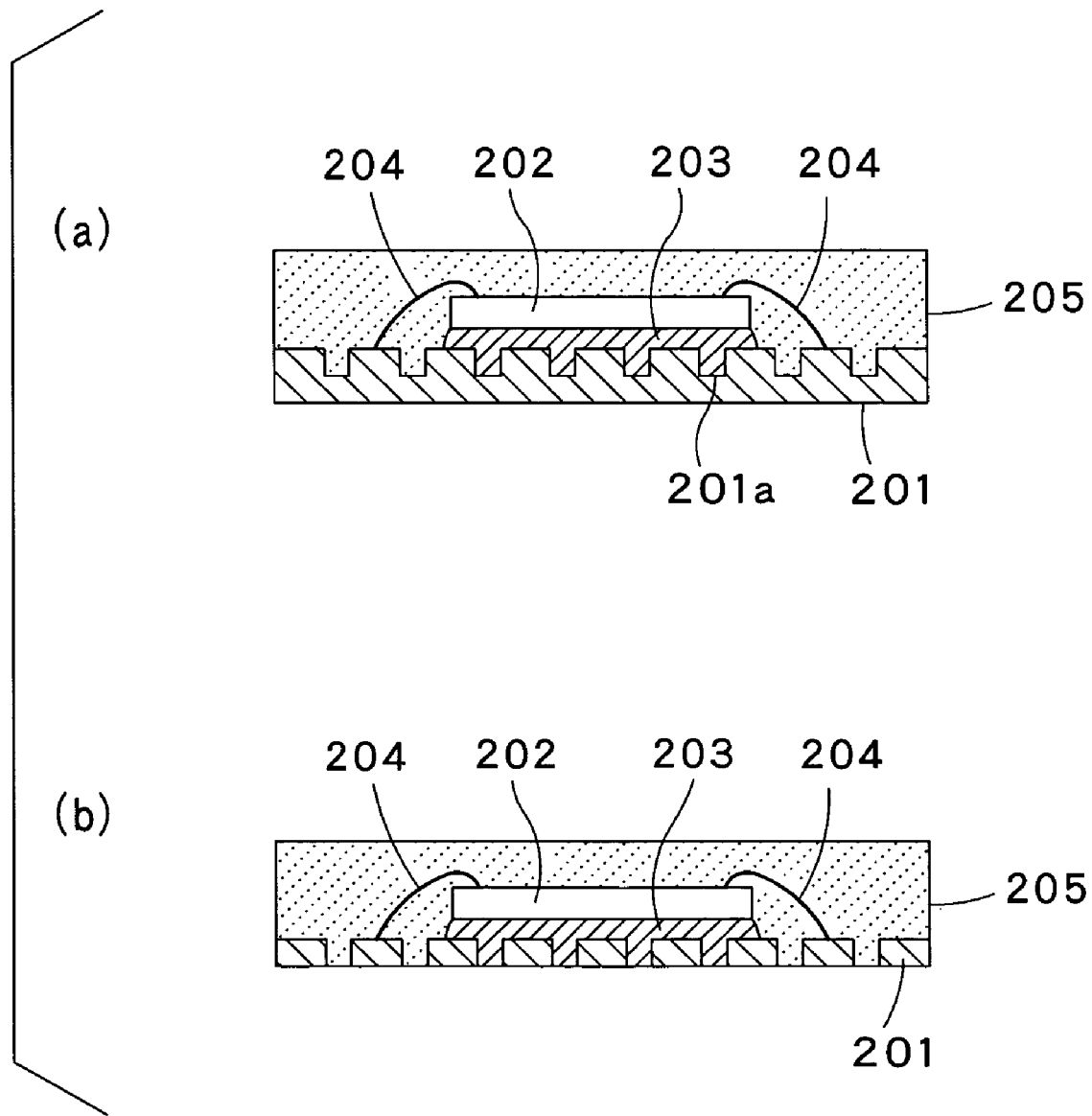
FIGS. 12(a) and 12(b) are diagrams illustrating another example of a conventional semiconductor device having a leadless structure.

It is noted that in the production method of a semiconductor device according to the present invention, it is practical to produce the semiconductor devices collectively in plural numbers. FIGS. 10(a) and 10(b) show such a case. FIG. 10(a) is a diagram schematically showing a plan view of the adhesive sheet 50 including a plurality of substrate B for use in production of multiple semiconductor devices. On the adhesive sheet 50, a region 71 for fixing one semiconductor device thereon and electrically conductive portions formed around it are shown as one block 70, each block 70 being formed in a square pattern and provided in large numbers. FIG. 10(b) is an enlarged view of one block 70, in which only a required number of electrically conductive portions 20 are formed around the region 71 for fixing a semiconductor device thereon.

In FIG. 10(a), for example, the width (W) of the adhesive sheet 50 is 65 mm, and the multiple blocks 70 are formed on the adhesive sheet 50 through predetermined steps, so that a base material continuously wound around a roll can be produced. The so obtained 65 mm-width adhesive sheet 50 is cut suitably to obtain a required number of blocks for use in the steps of loading semiconductor elements and sealing them with a resin, so as to use the cut ones as the substrates B to be used for producing semiconductor devices. Thereafter, in the case of collectively sealing such multiple semiconductor devices with a resin, the adhesive sheet is separated after sealing with a resin, followed by dicing or punching into predetermined dimensions to create individual pieces, thus obtaining semiconductor devices P.

In the substrate B for use in production of semiconductor substrates of FIG. 10(a), if the electrically conductive portion 20 extends in a cutting region 72 to be cut into predetermined dimensions using dicing or punching, i.e., in a region defined by a predetermined width for a cutting line to cover a range that a cutting means might be in contact, metal powder may be produced with the cutting operation, thus a short circuit may tend to occur due to the metal powder remaining attached to the semiconductor device in the subsequent mounting step. As a countermeasure for such an inconvenience, it is preferred that each electrically conductive portion 20 does not extend over the cutting region 72. In the semiconductor device P produced by using the substrate B for use in production of semiconductor devices including such arrangement, each electrically conductive portion 20 is not exposed outside from side faces after the formation of each individually cut piece. Therefore, in a state where the semiconductor device P is mounted onto a printed circuit board, the terminals (electrically conductive portions) are hidden when viewed from the outside, thus preventing illegality of directly accessing the terminals.

As a specific example of the plating layer 62 of the electrically conductive portion, it is possible to form the plating layer 62 by layering a palladium plating having a thickness of 0.1 μm and a gold plating 64 having a thickness of 0.05 μm, as the precious metal layer, on a nickel plating having a thickness of 5 μm as the diffusion barrier layer 63. Of course, the plating layer 62 is not limited to this example, but may be formed in various combinations and thicknesses depending on the requirements for the semiconductor device P to be produced. In addition, the total thickness of the plating layer 62 for the electrically conductive portion also depends on the requirements for the semiconductor device P, but usually, a range of from 0.05 to 50 μm is preferred.

The adhesive sheet 50 used for the production method of the semiconductor device according to the present invention preferably can securely fix the semiconductor element 10 and the electrically conductive portions 20 until completion of the sealing step using the resin, and can be peeled off with ease when being separated from the sealing resin 40. As described above, such an adhesive sheet 50 has the base layer 51 and the adhesive layer 52. The thickness of the base layer 51 is not critically limited, although it is usually in the range of from 12 to 200 μm, and preferably 50 to 150 μm. The thickness of the adhesive layer 52 is not limited in particular, but is usually in the range of from 1 to 50 μm, and preferably 5 to 20 μm.

For the adhesive sheet 50, it is preferred that the elastic modulus at 200° C. of the base layer 51 is greater than 1.0 GPa and that the elastic modulus at 200° C. of the adhesive layer 52 is greater than 0.1 MPa. By using a material having such an elastic modulus as the adhesive layer 52, each lower plating layer 62 for the electrically conductive portion can be pressed and embedded in the adhesive layer 52 due to the pressure in the step shown in FIG. 8(d). Thus, in the stage of completion of the semiconductor device P shown in FIG. 6(d), the so-called standoff state that the lower overhanging portion 20a of each electrically conductive potion 20 is projected out from the surface of the sealing resin can be achieved, thereby enhancing the reliability of mounting the semiconductor device.

In the step of loading the semiconductor element wherein wire bonding is provided, the temperature is controlled to a high temperature condition of approximately 150 to 200° C. Therefore, heat resistance for withstanding such a high temperature condition is required for the base layer 51 and the adhesive layer 52 of the adhesive sheet 50. In light of such a situation, it is preferred to use a material, as the base layer 51, having an elastic modulus at 200° C. of greater than 1.0 GPa, more preferably greater than 10 GPa. Generally, it is preferred that the elastic modulus of the base layer 51 is approximately 1.0 GPa to 1000 GPa. As the adhesive layer 52, it is preferred to use a material having an elastic modulus greater than 0.1 MPa, more preferably greater than 0.5 MPa, still more preferably greater than 1 MPa. Generally, it is preferred that the elastic modulus of the adhesive layer 52 is approximately 0.1 to 100 MPa. The adhesive layer 52 having such an elastic modulus is unlikely to be softened or flow in the step of loading the semiconductor element, thus enabling stable wire bonding. The details of measurement of the elastic modulus will be described in the following Examples.

The base layer 51 of the adhesive sheet 50 may be organic or inorganic. Considering the handling property upon conveyance, a warp caused by molding and the like, it is preferred to use a metal foil. As the metal foil, an SUS foil, Ni foil, Al foil, copper foil or copper alloy foil can be mentioned. It is preferred to select the copper foil or copper alloy foil because it is available at a low price and variety of types. The metal foil to be used as the base layer 51 is preferably subjected to a roughening treatment on its one side in order to ensure the anchoring property to the adhesive layer 52. As the method of roughening treatment, any of a physical roughening technique such as traditionally known sandblast or a chemical roughening technique such as etching or plating may be used.

As the adhesive for forming the adhesive layer 52 of the adhesive sheet 50, though not limited in particular, it is preferred to use a thermosetting adhesive containing an epoxy resin, an epoxy curing agent and an elastomer. In the case of the thermosetting adhesive, usually, attachment of the substrate can be carried out in an uncured state or in the so-called B stage, that is, it can be carried out at a relatively low temperature, i.e., lower than 150° C. In addition, by curing the adhesive after the attachment, the elastic modulus can be enhanced as well as the heat resistance can be improved.

As the epoxy resin, there can be mentioned glycidilamine-type epoxy resins, bisphenol F-type epoxy resins, bisphenol A-type epoxy resins, phenol novolac-type epoxy resins, cresol novolac-type epoxy resins, biphenyl-type epoxy resins, naphthalene-type epoxy resins, aliphatic epoxy resins, aliphatic cyclic epoxy resins, heterocyclic epoxy resins, spiro-ring containing epoxy resins or halogenated epoxy resins, and these compounds may be used alone or in combination of the two or more of them. As the epoxy curing agent, various imidazole compounds and derivatives thereof, amine-type compounds, dicyandiamide, hydrazine compounds or phenol resins can be mentioned, wherein these compounds may be used alone or in combination of the two or more of them. As the elastomer, acryl resins, acrylonitrile-butadiene copolymers, phenoxy resins or polyamide resins can be mentioned, wherein these compounds may be used alone or in combination of the two or more of them.

The adhesive strength to a test metal foil of the adhesive layer 52 is preferably in the range of from 0.1 to 15N/20 mm, more preferably 0.3 to 15N/20 mm. The adhesive strength can be selected appropriately in the range described above depending on the size of each electrically conductive portion. Namely, it is preferred that when each electrically conductive portion is of a large size, the adhesive strength is set at a lower value and that when the electrically conductive portion is of a small size, the adhesive strength is set at a greater value. The adhesive sheet 50 having such an adhesive strength displays a proper adhesive strength, thus reducing or eliminating misregistration of each electrically conductive portion fixed to the adhesive layer in the course from the step of forming substrates to the step of loading semiconductor elements. Meanwhile, in the step of separating the adhesive sheet, the separability of the adhesive sheet 50 from the semiconductor device can be enhanced, thus reducing damage to be given to the semiconductor device. The details of measurement of the adhesive strength will be described in the following Examples.

To the adhesive sheet 50, an antistatic function can be provided as needed. In order to provide an antistatic function to the adhesive sheet 50, there is a method of incorporating an antistatic agent and an electrically conductive filler into the base layer 51 and the adhesive layer 52. Alternatively, there is a method of coating an antistatic agent on an interface between the base layer 51 and the adhesive layer 52 and/or on the back face of the base layer 51. The provision of such an antistatic function can control static electricity to be generated upon separating the adhesive sheet from the semiconductor device.

As the antistatic agent, any material having a proper antistatic function can be used without limitation. Specifically, for example, acryl-type amphotetic, acryl-type cationic or maleic anhydride-styrene-type anionic surfactants or the like can be used. As the material for the antistatic layer, specifically, Bondip PA, Bondip PX, Bondip P (manufactured by Konishi Co., Ltd.) or the like can be mentioned. As the electrically conductive filler, commonly known materials can be used. For example, metals, such as Ni, Fe, Cr, Co, Al, Sb, Mo, Cu, Ag, Pt, Au or the like, alloys or oxides thereof, carbon, such as carbon black can be mentioned. These materials can be used alone or in combination of the two or more thereof. The electrically conductive filler may be powder or fibrous. Furthermore, commonly known various additives, such as antioxidants, pigments, plasticizers, fillers, adhesion-rendering agents or the like can be added.

EXAMPLES

Example 1

Preparation of an Adhesive Sheet 100 parts by weight of a bisphenol A-type epoxy resin (produced by Japan Epoxy Resin Co., Ltd ("Epicoat 1002")), 35 parts by weight of an acrylonitrile-butadiene copolymer (produced by Nippon Zeon Co., Ltd. ("Nippol 1072J")), 4 parts by weight of a phenol resin (produced by Arakawa Kagaku Co., Ltd. ("P-180")) and 2 parts by weight of imidazole (produced by Shikoku Fine Co., Ltd. ("C11Z")) were dissolved in 350 parts by weight of methyl ethyl ketone to obtain a solution of an adhesive. This solution was then coated on a copper alloy foil 51 (produced by Japan Energy Co., Ltd. ("BHY-13B-7025")) having a thickness of 100 μm, with its one side roughened. Thereafter, the coated solution was dried for 3 minutes at 150° C. to obtain an adhesive sheet 50 on which an adhesive layer having a thickness of 15 μm is formed. The elastic modulus of the adhesive layer 52 of the adhesive sheet 50 at 100° C. prior to the curing was $2.5 \times 10^{-3}$ Pa, while its elastic modulus at 200° C. after the curing was 4.3 MPa, and the adhesive strength to the copper alloy foil was 12N/20 mm. Additionally, the elastic modulus at 200° C. of the copper alloy foil used as a base layer 51 was 130 GPa. (Preparation of a Substrate for Producing Semiconductor Devices)

First, a dry film resist 61 (produced by Tokyo Ouka Co., Ltd. ("Odil AR330")) was laminated on both faces of a copper foil ("Olin 7025") 60 having a thickness of 40 μm. Then, patterning of the dry film resists was performed using a pattern which is reverse to the shape of the electrically conductive portions by using the photolithography. Next, using the so patterned dry film resists as a mask, nickel plating layers 62 for the electrically conductive portions were formed by successively providing nickel plating and Au plating on both faces of the copper foil. Thereafter, the dry film resists were removed. Subsequently, the copper foil 60 on which layered structures each composed of the nickel plating layer and the Au plating layer were partially arranged was attached onto the adhesive sheet 50 via the adhesive layer 52. At this time, the attachment was performed with the layered structures being pressed against the adhesive sheet 50 such that they can be embedded in the adhesive layer. Then, sufficient heating and pressurization were applied to prevent a gap from being created between the plating portions 62 and the adhesive layer 52. Thereafter, the copper foil was etched using the Au plating layers as a resist so as to form the electrically conductive portions. In this case, etching a side face of copper metal foil 60 can provide overhanging portions 20a each comprising Au and nickel at the top and bottom portions of the copper foil. Subsequently, the so formed structure was dipped in a chemical liquid system comprising sulfuric acid and hydrogen oxide so as to roughen the side face 60a of each copper foil 60. In the treatment of the side face 60a of each copper foil 60, the roughening process was performed by controlling the treating conditions such that the Ra (surface roughness) becomes greater than 0.2 μm. Finally, the outer shape of the adhesive sheet was processed by press working.

Thereafter, the electrically conductive portions 20 were formed on the adhesive sheet 50 by using a pattern as illustrated by the example of FIGS. 10(a) and 10(b) (W was 65 mm). In this case, on each side of a square defining one block 70, sixteen units of electrically conductive portions 20 were formed, and thus providing 64 units in total of electrically conductive portions 20 in each block 70

(Loading of a Semiconductor Element)

A test aluminum deposited silicon chip 10 (6 mm×6 mm) was securely fixed to a face (corresponding to a region designated by reference numeral 71 in FIG. 10(b)) of the adhesive layer 52 of the adhesive sheet 50. Specifically, after attachment under conditions of 175° C., 0.3 MPa for 1 second, the chip was fixed by drying at 150° C. for 1 hour. Then, using gold wires of a 25 μm thickness, electrodes of the silicon chip and the electrically conductive portions were bonded. The number of points of the wire bonding was sixty four per one chip.

For 10 units (one unit is 4×4 chips), i.e., 160 pieces of the aluminum deposited chips, the wire bonding was performed. As a result, the successful rate of the wire bonding was 100%. Subsequently, molding with a sealing resin. (produced by Nitto Denko Co., Ltd. ("HC-100")) was performed by utilizing transfer molding. After the resin molding, the adhesive sheet was peeled off from the resin molding at a room temperature. Furthermore, post curing was performed in a drier at 175° C. for 5 hours. Thereafter, the post-cured structure was cut by a dicing machine into each one block to obtain the semiconductor devices P.

When observing the interior of each semiconductor device P by using a soft ray apparatus (microfocus X ray television fluoroscope, produced by Shimazu Seisakusho Co., Ltd. ("SMX-100")), it could be confirmed that semiconductor devices P including no wire deformation or chip displacement and exhibiting highly enhanced joining strength between the electrically conductive portions 20 and the sealing resin 40, were obtained. In addition, each electrically conductive portion 20 has a lower overhanging portion 20a projecting outside from the sealing resin 40.

The conditions of the wire bonding, transfer molding, elasticity modulus measuring method, adhesive strength measuring method, and the successful rate of the wire bonding are as follows:

(Conditions of Wire Bonding)
Apparatus: Produced by Shinkawa Co., Ltd. ("UTC-300BI SUPER")
Ultrasound frequency: 115 KHz
Ultrasound outputting time: 15 milliseconds
Ultrasound output: 120 mW
Bonding load: 1018N
Searching load: 1037N
(Conditions of Transfer Molding)
Apparatus: TOWA molding machine
Molding temperature: 175° C.
Time: 90 seconds
Clamping pressure: 200 KN
Transfer Speed: 3 mm/sec
Transfer Pressure: 5 KN
(Elasticity Modulus Measuring Method)
Subjects to be measured: Both of the base layer and the adhesive layer
Evaluating equipment: Visco-elasticity spectrometer produced by Reometrics Co., Ltd. ("ARES")
Rising temperature speed: 5° C./min
Frequency: 1 Hz
Measuring mode: Pulling mode
(Adhesive Strength Measuring Method)

After laminating the adhesive sheet 50 having a with of 20 mm and a length of 50 mm on a 35 μm copper foil (produced by Japan Energy Co., Ltd. ("C7025")) under the conditions of 120° C., 0.5 MPA and 0.5 m/min, the laminated structure was left in a 150° C. hot-air oven for 1 hour, and the 35 μm copper foil was then pulled in an atmosphere of a temperature of 23° C. and a relative humidity of 65% RH, at a pulling speed of 300 mm/min, in the direction of 180°, thereby determining the adhesive strength as the central value of the measures.

(Successful Rate of the Wire Bonding)

The pulling strength of the wire bonding was measured by using a bonding tester ("PTR-30") produced by Reska Co., Ltd. in the measuring mode of the Pulling test, at a measuring speed of 0.5 mm/sec. The pulling strength was regarded as success when it was 0.04N or greater while regarded as failure when lower than 0.04N. The successful rate of the wire bonding was obtained by calculating the successful rate from the measured results.

Example 2

Semiconductor devices were produced in the same manner as in Example 1 except that an 18 μm copper-nickel alloy foil (produced by Japan Energy Co., Ltd. ("C7025")) was used as the metal foil. As a result, the successful rate of the wire bonding was 100%. When observing the interior of each semiconductor device, it could be confirmed that semiconductor devices including no wire deformation or chip displacement and exhibiting highly enhanced joining strength between the electrically conductive portions and the sealing resin, were obtained.

While the embodiments of the present invention have been described in detail, the semiconductor device and the method of producing thereof according to the present invention are not limited in any way to these embodiments. It should be construed that various modifications can be made without departing from the scope and spirit of the present invention.

The invention claimed is:

1. A method of producing a semiconductor device, comprising the steps of:
preparing a substrate for use in production of a semiconductor device, which substrate includes an adhesive sheet having a base layer and an adhesive layer provided on the base layer, and a plurality of electrically conductive portions provided on the adhesive layer of the adhesive sheet, wherein each electrically conductive portion includes a metal foil comprising copper or a copper alloy, and plating layers for an electrically conductive portion, the plating layers being provided on upper and lower portions of the metal foil, and wherein the plating layers for each electrically conductive portion provided on the upper and lower portions of the electrically conductive portion constitutes an overhanging portion which overhangs outside from the metal foil, and wherein
the plating layer of the electrically conductive portion on the lower portion of the metal foil is embedded within the adhesive layer of the adhesive sheet;
fixing each semiconductor element having electrodes onto the adhesive layer of the substrate for use in production of the semiconductor device, and electrically connecting the electrically conductive portions and the electrodes of the semiconductor element with wires while the plating layer of the electrically conductive portion on the lower portion of the metal foil is embedded within the adhesive layer of the adhesive sheet;

sealing the semiconductor element, wires and electrically conductive portions by using a sealing resin while the plating layer of the electrically conductive portion on the lower portion of the metal foil is embedded within the adhesive layer of the adhesive sheet;

separating the adhesive sheet from the sealing resin, wherein before the adhesive sheet is separated from the sealing resin, the plating layer of the electrically conductive portion on the lower portion of the metal foil is embedded within the adhesive layer of the adhesive sheet; and dividing the sealing resin into an individual piece for each semiconductor element.

2. The method of producing a semiconductor device according to claim 1, wherein
the sealing resin is divided along cutting regions cut by dicing or punching, and
the electrically conductive portions are placed so that the electrically conductive portions do not extend over the cutting regions.

3. A semiconductor device produced by the method of claim 1.

* * * * *